US008737435B2

(12) United States Patent
Jung et al.

(10) Patent No.: US 8,737,435 B2
(45) Date of Patent: May 27, 2014

(54) ENCODER, DECODER, ENCODING METHOD, AND DECODING METHOD

(75) Inventors: Hee-Won Jung, Suwon-si (KR);
Seung-Gun Park, Yongin-si (KR);
Gi-Sang Lee, Hwaseong-si (KR);
Jun-Ho Koh, Suwon-si (KR);
Sang-Mook Lee, Suwon-si (KR);
Sergey Zhidkov, Izhevsk (RU)

(73) Assignee: Samsung Electronics Co., Ltd. (KR)

( * ) Notice: Subject to any disclaimer, the term of this patent is extended or adjusted under 35 U.S.C. 154(b) by 362 days.

(21) Appl. No.: 12/782,520

(22) Filed: May 18, 2010

(65) Prior Publication Data
US 2010/0290484 A1 Nov. 18, 2010

(30) Foreign Application Priority Data

May 18, 2009 (RU) .............................. 2009119776
Apr. 9, 2010 (KR) ........................ 10-2010-0032589

(51) Int. Cl.
*H04J 3/04* (2006.01)
*H04J 3/24* (2006.01)
*H04L 5/12* (2006.01)

(52) U.S. Cl.
USPC ........... 370/535; 370/474; 375/265; 704/227; 704/278

(58) Field of Classification Search
USPC ................... 370/464, 474, 536, 542; 375/260
See application file for complete search history.

(56) References Cited

U.S. PATENT DOCUMENTS

| 4,991,207 | A | * | 2/1991 | Shiraishi et al. .............. 380/271 |
| 5,418,578 | A | | 5/1995 | Culling |
| 5,642,241 | A | * | 6/1997 | Kim ................................ 360/41 |
| 5,646,698 | A | * | 7/1997 | Yang et al. .................... 348/475 |

(Continued)

FOREIGN PATENT DOCUMENTS

| JP | 07-274169 | 10/1995 |
| JP | 7-288752 | 10/1995 |

(Continued)

OTHER PUBLICATIONS

Azizul H. Quazi et al., "Underwater Acoustic Communications", IEEE Communications Magazine, Issue 20, vol. 2, 1982.

(Continued)

*Primary Examiner* — Yemane Mesfin
*Assistant Examiner* — Peter Chen
(74) *Attorney, Agent, or Firm* — The Farrell Law Firm, P.C.

(57) ABSTRACT

An encoder includes a precoder for encoding an input information object according to a preset encoding scheme and storing the encoded information object in a precoder buffer, a sample number/address generation unit for generating a sample number of each sample and an address, which corresponds to each bit of each sample and the address of the precoder buffer, a multiplexer for selecting a bit of the precoder buffer corresponding to the address generated by the sample number/address generation module, a sampling buffer for storing a bit of each sample output from the multiplexer, a control packet generation module for generating a control packet including information on the sample number generated by the sample number/address generation module, a packet assembling unit for assembling the sample stored in the sampling buffer with the control packet generated by the control data generation module, and a modulation module for modulating the packet output from the packet assembling unit into a sound signal according to a preset scheme.

23 Claims, 4 Drawing Sheets

(56) References Cited

U.S. PATENT DOCUMENTS

| | | |
|---|---|---|
| 5,870,393 A | 2/1999 | Yano et al. |
| 6,359,904 B1* | 3/2002 | Hamalainen et al. .......... 370/469 |
| 6,452,952 B1* | 9/2002 | Okuhara ........................ 370/536 |
| 6,606,355 B1 | 8/2003 | Wei |
| 7,123,645 B2* | 10/2006 | Ishizu et al. ................... 375/147 |
| 8,499,159 B2* | 7/2013 | Loytynoja et al. ............. 713/176 |
| 2004/0001553 A1 | 1/2004 | Steentra et al. |
| 2004/0196986 A1* | 10/2004 | Nam ................................ 381/92 |
| 2005/0047448 A1* | 3/2005 | Lee et al. ....................... 370/536 |
| 2006/0045116 A1* | 3/2006 | Lee et al. ....................... 370/432 |
| 2006/0115098 A1* | 6/2006 | Petuhov et al. .................. 381/98 |
| 2007/0005795 A1 | 1/2007 | Gonzalez |
| 2007/0127671 A1* | 6/2007 | Chua et al. ................. 379/202.01 |
| 2010/0197231 A1* | 8/2010 | Kenington ..................... 455/63.1 |

FOREIGN PATENT DOCUMENTS

| | | |
|---|---|---|
| JP | 2003-513538 | 4/2003 |
| KR | 100580835 | 5/2006 |
| RU | 2 085 046 | 7/1997 |
| RU | 2 298 878 | 5/2007 |
| WO | WO 2004/030358 | 4/2004 |

OTHER PUBLICATIONS

Milica Stojanovic et al., "Underwater Acoustic Communication Channels: Propagation Models and Statistical Characterization", IEEE Communications Magazine, Jan. 2009.

* cited by examiner

—— TRANSMISSION SIGNAL SPECTRUM
------ SOUND NOISE SPECTRUM

ENCODER, DECODER, ENCODING METHOD, AND DECODING METHOD

PRIORITY

This application claims priority to an application filed with the Russian Intellectual Property Office on May 18, 2009 and assigned Serial No. RU2009119776 and the Korean Intellectual Property Office on Apr. 9, 2010 and assigned Serial No. 10-2010-0032589, the contents of which are incorporated herein by reference.

BACKGROUND OF THE INVENTION

1. Field of the Invention

The present invention relates generally to encoding and decoding schemes and data transmission and reception devices for wireless communication systems, and more particularly to facilitating the systems of short-range communication between stationary or mobile devices and mobile (including portable) devices, using an acoustic communication channel for data transfer over short distances.

2. Description of the Related Art

Encoding and data transfer apparatuses, used for different types of communication channels are widely known, and include a disassembler for disassembling an information object into data packets, wherein each packet is conveyed in a certain sequence to the error-correcting coding unit, the interleaver, the unit of control data addition.

The encoded packets are conveyed to the modulator, synchronization sequence addition unit and further to the encoder output for transmission through the communication channel. High noise immunity of data transfer is usually achieved by means of encoding with a high level of redundancy, enabling transmission of the objects with an increased probability of error-free reception in the communication channel with considerable interference, but causing a significant decrease in the object transmission speed on the other hand.

There are systems of information objects transfer by means of audible tones, including transceiver T (including a transmission apparatus) both in the receiving and transmitting section. Nonetheless, during the transmission, transceiver T1 includes a disassembler for disassembling an information object into data packets, each of which is conveyed to the encoder and the interleaver in a certain consequence. Furthermore, the transceiver T1 includes a modulator, where the converted packets are modulated by the audio signals and conveyed to transceiver 2 through the digital-to-analog converter and the loudspeaker. While reception at the analog-to-digital converter of transceiver 2, the audio signal received through the microphone is digitized, then is transferred successively to the synchronization unit, demodulator, deinterleaver, decoder, data restorer. At the same time, each incoming data packet is restored, the transmitted object is gradually received and its quality/integrity is determined. In case of losses transceiver T2 transmits a corresponding signal to transceiver T1, after conveying of the said signal, the new parameters of transmission through the acoustic communication channel are established (for example, power of the acoustic tone is increased) and the object is repeatedly transferred to transceiver T2. A drawback of such systems is the complexity of apparatuses in receiving and transmitting section, since a feedback mechanism is obligatory between the apparatuses in the receiving and transmitting sections (each of them must contain transceiver); slow response to the changing noise situation and, as a consequence, low rate of information objects transmission.

There also exist acoustic transmission systems, where the information object transmission speed is constant, does not take into account interference (acoustic) or environment (degree of noisiness of acoustic channel). Also, there is a feedback communication channel used for adjusting modulation type or speed of the error-correcting code.

The most relevant is a system of the acoustic data transmission without feedback, in which the transmission apparatus encodes the information object en bloc and cyclically repeats its transmission. The receiving apparatus in the receiving mode makes attempts to receive the encoded object until its error-free reception is achieved.

The drawback of the system is its inefficiency. In the case of at least one error during reception, repeated transmission is expected and the transmitted code and the audible tone parameters remain unchanged. Thus, during objects transmission, especially of a large amount of data, the possibility of erroneous reception increases drastically, and the transmission speed decreases and can not be optimal for the arbitrary signal to noise ratio in the communication channel. Therefore, an information object transmission either with high noise immunity (a lot of redundant (checking) data during object encoding) is necessary so that the error-free reception can be provided by means of one-two repetitions, which affects the speed, or increased transmission speed, in which case, noise increase in the communication channel adversely affects the noise immunity and the object may not be received at all.

SUMMARY OF THE INVENTION

The present invention relates to encoding and information transmission devices for wireless communication systems.

An object of the present invention is the creation of an encoder, transmission apparatus, and an information object transmission system, enabling the considerable increase of transmission speed of information objects compared to existing devices and systems, using an optimal volume of the transmitted information and optimal redundancy of the error-correcting code in the chosen communication channel. Creation of such apparatuses and the system will enable transmission of the information objects of any size, which will increase their scope of application considerably.

The object is achieved by the fact that in the encoder, transmission apparatus and information object transmission system, received data (information object and its size) is encoded through the primary and the control channel. At the same time, the information object is previously encoded by any known method and pseudorandom samples of the specific size are formed from the resulting data block.

Control data, including the object size and the current sample number is encoded with high redundancy. Then the samples and the control packet of the optimal volume are combined into the data packet for transmitting, which is converted to the signal for transmission through the communication channel. The information object is transmitted by continuous transmission of pseudorandom data packets through the communication channel, which enables error-free reception of large information objects at a high speed during iterative decoding.

The object is achieved in the encoder, herein the precoder, the first and the second inputs of which being the respective data inputs of the encoder, and the modulator, connected through the synchronization sequence addition unit to the output of the encoder.

Meanwhile, at least one input/output of the precoder is coupled to the respective input/output of the multiplexer, connected through the sampling buffer to the first input of the packet assembly unit, forming the primary encoder channel, while the second input of the encoder through the successively connected control data generation unit and control data encoder is connected to the second input of the packet assembly unit, thus forming the control channel.

The sample number generator is coupled to the control data generation unit, as well as to the multiplexer through the encoder address generator, connected to the second input of the encoder, and the output of the packet assembly unit is coupled to the modulator. The encoder is configured to enable the sample number generator to start-up.

It is preferable that the precoder includes the successively connected container compacting unit, the first and the second inputs of which function as the respective inputs of the precoder, repeating/interleaving unit, convolution encoder, precoder buffer.

The second input of the encoder is coupled to the repeating/interleaving unit, and the modulator includes multiple carriers.

The output of the packet assembly unit is coupled to the modulator through the spectrum corrector.

The encoder includes at least one additional input and/or output.

The additional input of the encoder is coupled to the spectrum corrector through the successively connected communication channel analyzer and spectrum estimator. It enables the provision of a dynamic response to the changing interference-environment in the communication channel.

An object of the present invention is achieved by the transmission apparatus being configured to supply respective power to all the circuit elements, requiring in-feed, and including the encoder, digital-to-analog converter and the loudspeaker. At the same time the encoder is implemented in one of the abovementioned embodiments.

The transmission apparatus and/or encoder include at least one additional input and/or output.

The Microphone M1 of the transmission apparatus is connected to the additional input of the encoder, being the additional input of the transmission apparatus and connected to the spectrum corrector through the successively connected communication channel analyzer and spectrum estimator, through the analog-to-digital converter of the transmission apparatus. Thus enabling the provision of a dynamic response to the changing interference (particularly acoustic) environment in the communication channel, at the same time using peculiarities of the aural perception of acoustic noises by the human.

The object is also achieved in a system of information object transmission, including the transmitting and the receiving apparatuses, configured to enable corresponding power supply to all the circuit elements, requiring power supply. The transmission apparatus includes an encoder, a digital-to-analog converter and a loudspeaker. The encoder is implemented in one of the abovementioned embodiments. The transmission apparatus may additionally include a microphone (M1) and an analog-to-digital converter, for the purpose of changing the transmitted audible tone characteristics depending on acoustic channel condition between the transmitting and the receiving apparatuses during the transmission of each packet, applying and taking into account peculiarities of the aural perception of acoustic noises by the human.

The receiving apparatus of the system includes the receiving device microphone, connected to the input of the decoder through the analog-to-digital converter of the receiving apparatus. The decoder includes the synchronizer and the demodulator, successively connected to the input of the decoder, as well as the data integrity checking unit and the unpacking/restoring unit, successively connected to the decoder output, being the data output of the receiving apparatus.

In the decoder the received packet is divided into the primary (sample) channel data and the control channel data. For this purpose the demodulator is coupled to the first demultiplexer, the first output of which is coupled to the first input of the second demultiplexer, and the outputs of the second demultiplexer are connected through the respective summation units to the corresponding inputs of the storage buffer. The second output of the first demultiplexer is coupled to the control channel decoder, the first and the second outputs of which are connected to the corresponding inputs of the decoder address generator, the output of which is connected to the second input of the second demultiplexer. The storage buffer is connected to the data integrity checking unit through the iterative decoder.

The demodulator is connected to the first demultiplexer through the communication channel evaluation/compensation unit.

The receiving apparatus and/or the decoder include at least one additional input and/or output.

The data integrity checking unit is connected to the additional output of the decoder, being the additional output of the receiving apparatus.

The data integrity checking unit construction enables issuance of the iteration termination command to the iterative decoder.

Implementation of the present invention may be achieved, for example, by a program, based on the devices including a loudspeaker and a processor (for the transmission apparatus), and a microphone and a microprocessor (for the receiving apparatus), by upgrading the built-in basic software of the devices. Additional software of the devices, together with their basic software, has a blocked structure, is intended for processing, assembly, transmission, command and information exchange between the units, outside as well as inside.

Mobile telephones, pocket digital assistants, notebooks, Dictaphone recorders, audio players and other similar apparatuses may be used as devices.

A more detailed composition and operation of the encoder, the transmission apparatus and the information object transmission system (hereinafter referred to as system) will be illustrated by the example of the information object transmission system by means of audible tones, including the transmission apparatus with the encoder as a preferred version, and the receiving apparatus with the decoder as a preferred version.

The present invention creates the encoder, transmission apparatus, and the information object transmission system, enabling the considerable increase in transmission speed of information objects compared to existing devices and systems, using an optimal volume of the transmitted information and optimal redundancy of the error-correcting code in the chosen communication channel.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

Figure 1:
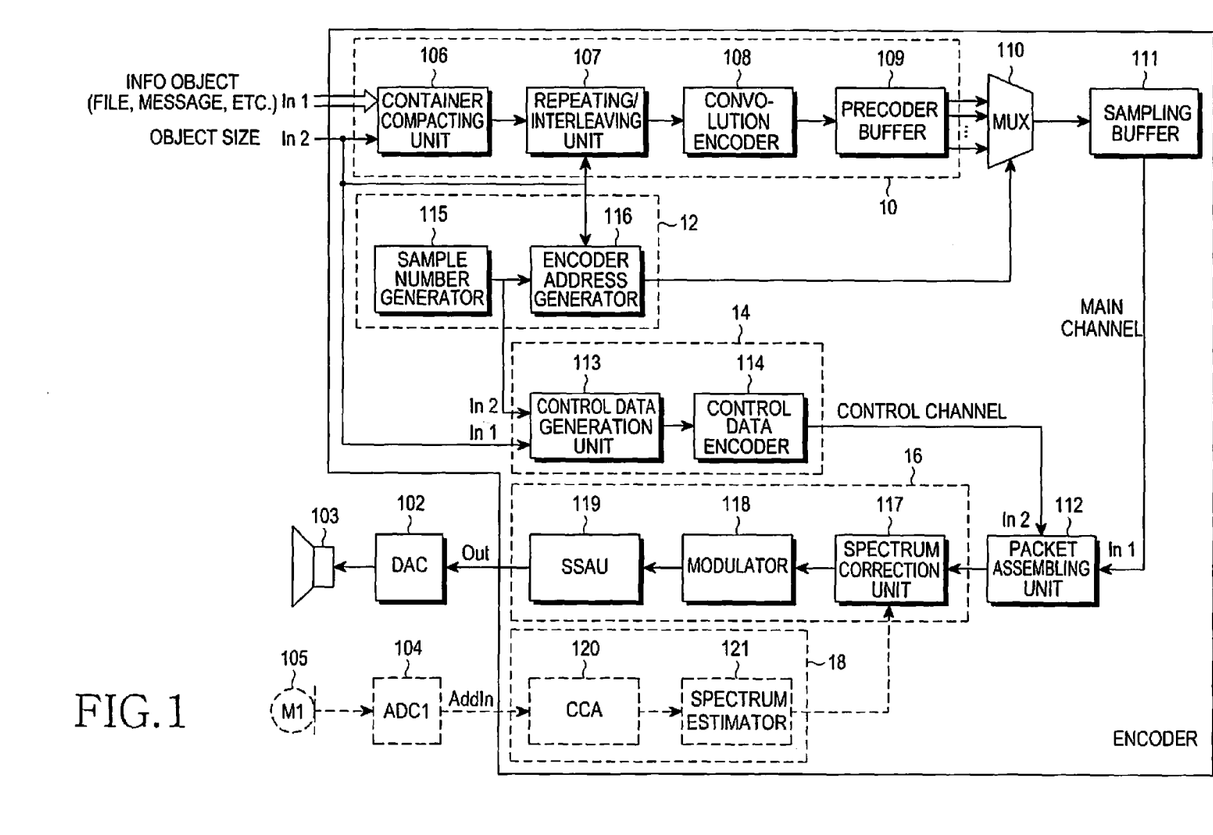
FIG. 1 is a block diagram of the transmission apparatus according to the present invention.

The transmission apparatus of the system, presented on FIG. 1, includes an encoder 1, the first input (In1) and the second input (In2) of which are informational. Digital to analogue converter (DAC 102) and loudspeaker 103 are successively connected to the output of the encoder. To the additional input (ad. Input) of the encoder, intended for communication channel diagnostics, through analog-to-digital converter ADC 104 of the transmission apparatus encoder, the microphone (M1) of the transmission apparatus 105 is connected.

The encoder 1 includes a precoder 10 for encoding an input information object according to a preset encoding scheme and storing the information object in a precoder buffer; a sample number/address generation unit 12 for generating a sample number of each sample and an address, which corresponds to each bit of each sample and the address of the precoder buffer; a multiplexer 110 for selecting a bit of each precoder buffer corresponding to the address generated by the sample number/address generation module 12; a sampling buffer 111 for storing a bit of each sample output from the multiplexer 110; a control packet generation module 14 for generating a control packet including information on the sample number generated by the sample number/address generation module 12; a packet assembling unit 112 for assembling the sample stored in the sampling buffer 111 with the control packet generated by the control data generation module 14; and a modulation module 16 for modulating the packet output from the packet assembling unit 112 into a sound signal according to a preset scheme.

Further, the encoder 1 may further include a spectrum calculation module 18 for receiving information on an exterior sound communication channel and calculating a sound spectrum based on the received sound communication channel, and the modulation module 16 may further include a configuration for compensating for the spectrum of the sound signal based on the information provided by the spectrum calculation module 18.

The sample number/address generation module 12 may include a sample number generator 115 and an encoder address generator 116, and the control packet generation module 14 may include a control data generation unit 113 and a control data encoder 114. Further, the modulation module 16 may include a spectrum correction unit 117, a modulator 118, and a synchronization sequence addition unit 119, and the spectrum calculation module 18 may include a communication channel analyzer 120 and a spectrum estimator 121.

The configuration and operation of the encoder 1 and the transmission apparatus as described will be described in more detail hereinafter.

In the embodiment shown in FIG. 1, the encoder 1 includes the apparatuses successively connected and forming the precoder 10: a container compacting unit (CCU) 106 of the input data, the inputs of which being at the same time the first input (In1) and the second input (In2) of the precoder, the encoder and the transmission apparatus, a repeating/interleaving unit (RIU) 107, a convolution encoder (CE) 108, and a precoder buffer (PB) 109. Inputs/Outputs of the precoder buffer 109 are inputs/outputs of the precoder 10 and are coupled to the respective inputs/outputs of multiplexer 110. The multiplexer output is connected through sampling buffer (SB) 111 to the first input (In1) of packet assembly unit (PAU) 112. In that way the channel of preparation of the primary encoder data is formed (primary channel).

The second input (In2) of the encoder 1 is connected to the first input (In1) of control data generation unit (CDSU) 113 and further—through the control data encoder (CDE) 114—to the second input (In2) of the packet assembly unit (PAU) 114. At the same time, the channel of the encoder control data preparation is formed (control channel).

The output of the sample number generator (SNG) 115 is coupled to the second input (In2) of the control data generation unit (CDSU), as well as with the multiplexer through the encoder address generator (EAG) 116, also connected to the second input (In2) of the encoder, the second input (In2) of the encoder 1 may be coupled to the additional input of the repeating/interleaving unit 107.

The output of the packet assembly unit (PAU) 112 is connected to the output of the encoder through the successively connected spectrum correction unit 117, modulator 118, and synchronization sequence addition unit (SSAU) 119.

The additional input (AddIn) of the encoder 1 is connected to the additional input of the spectrum correction unit 117 through the successively connected communication channel analyzer (CCA) 120 and spectrum estimator (SE) 121 for calculation of the optimal amplitude spectrum of the transferred signal.

The other additional inputs of the encoder 1 and/or transmission apparatus may be envisaged (not shown on FIG. 1). For example, a start input for signaling to specific encoder units of the necessity to transfer input data, as well as an input of the alternative communication channel, intended also for commanding to the encoder of the input data transfer termination.

The transmission apparatus circuit is configured to enable power supply of all circuit elements requiring it.

The transmitting section of the system, including the transmission apparatus, functions as follows.

The transmission apparatus is switched on when the encoder 1, the digital-to-analog converter 102, the analog-to-digital converter 104, the loudspeaker 103, and the microphone 105 are energized and in a standby mode.

On the preliminary stage of encoding during the input data entry to the first input (In1) of the transmitter (information object IO—file, message, application etc.), and to the second input (In2) of the transmitter—data of the IO size, coming simultaneously to encoder address generator 116 and to the first input (In1) of control data generation unit 113, in container compacting unit 106 an information object is packed into a standard container. For this purpose, a header label is added to the information object and a bite set for integrity checking (for example, check sum, CRC, Hash-code etc.)

Furthermore, in the container compacting unit 106, the container may be encoded by means of error-correcting code (e.g. Reed-Solomon code). The container (from the container compacting unit (CCU) and a size of information object (IO) (from the CCU or from the second input (In2) of the encoder) are conveyed to the repeating/interleaving unit 107, where the data bits of the container are repeated a definite number of times and mixed. Pseudorandom function of such rearrangement depends on the information object size.

Thereafter, a convolution code encoding is carried out in the convolution encoder 108. It is known that formation of encoded bits in the indicated manner (i.e. repeating with interleaving followed by convolution encoding) enables the achievement of a high noise-immunity of the code, in the case of iterative decoding at the receiving section (see example [3]). However, in the suggested technical solutions encoded in this manner, the information object (data block for transmission) is not directly transmitted to the modulator and in the communication channel. It is transferred to precoder buffer 109 from the convolution encoder.

The data block for transmission is stored in the precoder buffer for the main stage of encoding. Preliminary stage is carried out only once before beginning of transfer through the communication channel (in this embodiment—acoustic), leaving the precoder buffer content unchanged in the case of necessity of further adjustment of the transmission properties according to the changing communication channel.

It should be kept in mind that the precoder in the other embodiments of the suggested technical decisions may be formed by any known method. In which case the error-correcting code with arbitrary redundancy may be used.

Then, the basic stage of the encoding is carried out. In the switched on transmission apparatus, start up of sample number generator 115 is carried out by any method known (namely, by the command from the start input or repeating/interleaving unit). The sample number generator is generating identification numbers with a definite periodicity (random or successive values) for sampling of bits from the precoder buffer and conveys them to the encoder address generator and to the second input (In2) of control data generation unit 113.

When the data from the second input (In2) of the encoder 1 enters the encoder address generator 116 (which means information object entry into encoder 1), the received value of the sample number from the sample number generator 115 initializes the pseudorandom encoder address generator 116, forming a set of k addresses, which are successively conveyed to multiplexer 110. In accordance with a set of addresses via inputs/outputs of the multiplexer 110, pseudorandom sampling of k bits from the precoder buffer 109 is carried out and they are stored in the sampling buffer 111. The encoder address generator 116 generates k number of addresses within the range of 1 to N, where N is a number of bits in the precoder buffer 109 for the predetermined size of the container. Further, k is properly determined according to the value of the second input (In2) of the encoder, i.e. according to the information object size.

In this case, addresses may recur once or more times both in one set and during pseudorandom generation of the following address sets. In the preferred variant pseudorandom function of the encoder address generator is assigned so that the recurrence interval of generated addresses is maximal. At the same time it should be noted that the samples repetition does not result in considerable speed and noise immunity decrease of the transmission system under consideration providing optimal decoding in the receiving apparatus, presented on FIG. 3.

Sampling bits from the sampling buffer are conveyed to the first input (In1) of packet assembly unit 112, without application of additional error-correcting coding. Thus preparation for information objects fragments transfer is finalized in so called "primary channel".

At the moment of information entry from the second input (In2) of the encoder into the control data generation unit through the first input (In1), value of the sample number entering at the second input (In2) of the control data generation unit, from the sample number generator, initializes operation of the control data generation unit, which assembles control data, containing object size and/or container size (in consideration of the container compacting unit operation), sample identification number, and other auxiliary information as well. Control data in the control data encoder 114 is coded by the error-correcting code and the special checking symbols are added for checking the control packet integrity (e.g. its CRC, check sum etc.), receiving control packet, which is transmitted to the second input (In2) of the packet assembly unit. Thus, simultaneously with each sample formation in the "primary channel" corresponding to it control packet is formed in so called "control channel".

As a rule, codification in the control channel is carried out by a high redundancy code and consequently, high noise immunity, so that the control channel could be received in severe noise and interference conditions in the communication channel. At the same time, the control channel contains only a small amount of information compared to the information volume in the primary channel, that is why cumulative redundancy conditioned by the control channel presence is comparatively small.

Organization of such a two-channel codification (redundancy in the primary channel is small compared to the control channel redundancy) provides the possibility of considerable increase of information object transfer speed, of the large objects as well (the lower is the data redundancy of the primary channel, the higher is the information object transfer speed by means of pseudorandom samples). By the same degree of noise immunity in the primary and control channels, information object transfer speed also increases considerably due to high probability of iterative reception of separate samples and respectively, successful restoration of the information object.

The main channel and the control channel may have different security mechanisms and different physical formats. The control channel carries information, which enables decoding of the main channel and includes the length of an information object transmitted through the main channel and the sample number of a current sample. The sample number servers as a specific identifier for notifying a receiving apparatus of the data arrangement of the main channel.

In general, the encoding operation of the main channel includes two stages. In the first stage, the original information object is repeated several times and then interleaved. Then, the resultant object may be decoded by using, for example, convolution codes having a ratio of $1/(R+1)$ (that is, R parity bits are generated for each original bit of the information object), and all the bits decoded in the convolution encoder 108 are stored in the precoder buffer. In the second stage, during each packet generation interval, a set of preset bits are selected from the bits stored in the precoder buffer 109 according to the address generated by the encoder address generator 116. Thereafter, these bits are transmitted together with the control channel data.

Control packet bits and sample bits form optimal size data packets. The optimal packet size is chosen based on two considerations: on the one hand, as it was noted, volume of the data transferred through the primary channel must be considerably larger than the data volume in the control channel, so that the high redundancy of the code in the control channel does not considerably affect cumulative effectiveness of the transmission system; on the other hand, in many applications the packet transmission time must be comparatively short (e.g. 1 sec.) since the excessively long packet may result in undesirable delay during objects reception, especially small ones.

The data packet is modulated in the packet assembly unit by means of one or several kinds of modulation (such as BPSK, QPSK, n-QAM), adding special pilot symbols for simplifying evaluation and channel equalization procedure in the receiving apparatus. In the system under consideration broadband modulation with one or multiple carriers may be used (e.g., OFDM, CDMA etc.). In order to reduce perceptibility of the audible tone to the user, at the same time preserving an average power and wideband properties of the tone, tone spectrum is corrected in the spectrum corrector 117 prior to transmission to modulator 118, in which capacity a filter can be used for example, spectrum correction may be performed adaptively.

Such correction is possible if the apparatus includes the microphone (M1) 105 and the analog-to-digital converter 104. In this case, in communication channel analyzer (CCA) 120 audible tones are analyzed with definite periodicity, the said tones conveyed from the microphone (M1) 105 through the analog-to-digital converter (ADC1) 104, evaluating the level and spectral composition of the acoustic noise in the communication channel. In which case in the given system embodiment by the acoustic noise all the audible tones are meant (speech, music, audible tone of notification etc.), with exception of the signal, emitted by the transmission apparatus itself. Then, in compliance with a psycho-acoustic model of acoustic perception, implemented in the spectrum estimator (SE) 121, calculation of the optimal signal spectrum is carried out, by which the power of the signal is maximal provided its unchanged acoustic perceptibility.

Figure 2A:
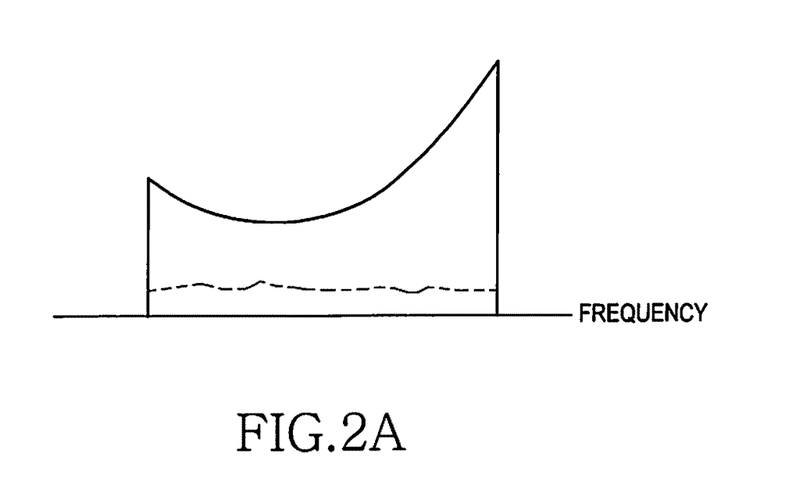
FIG. 2 illustrates an example of a distribution of the amplitude spectrum of the transmitted signal (a) in the case of the uniform spectrum of acoustic noises, and (b) in the case of the existence of acoustic noise, focused in the narrow band, according to the present invention.

In particular, in the spectrum estimator (SE) frequency concealment effect is applied, which is illustrated on FIG. 2, where the preferable signal spectrums are indicated with the firm line in the communication channels with acoustic noise (dash line). Thus, in case the acoustic noise level is close to the uniform (FIG. 2(*a*)), distribution of the amplitude spectrum is inversely proportional to the average sensitivity of the human ear to the noise signal (for example, such sensitivity characteristic is determined in the standard ITU-R 468).

Figure 2B:
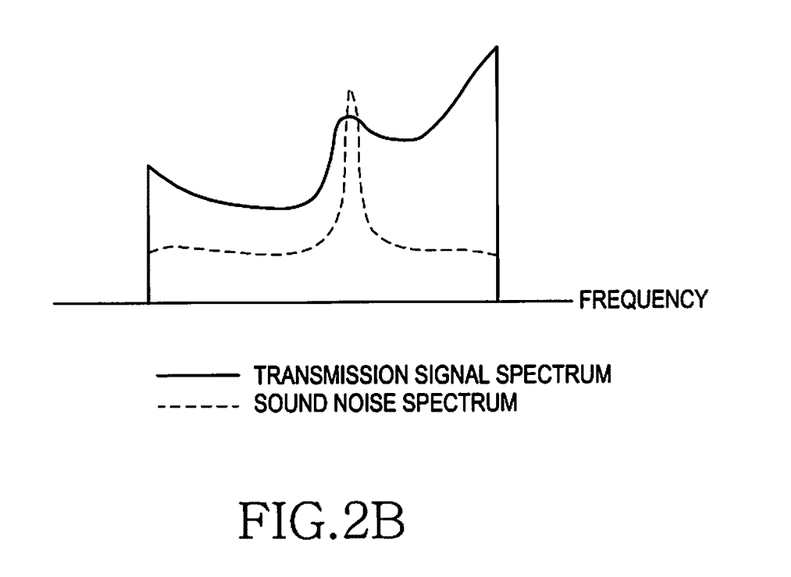

In case of severe acoustic interference with expressed peaks in the certain frequencies, optimal distribution will be determined by ear sensitivity to noise signals taking into account the frequency concealment effect. Such distribution example is given on FIG. 2(*b*). A severe unwanted audible tone is masking the signal components, located on the neighboring frequency intervals, that is why on the adjacent frequencies the intensiveness of the transferred signal may be increased without subjective increase of acoustic volume of the signal transferred.

From the spectrum estimator, estimated data is transferred to the spectrum corrector, where the spectrum correction of the signal is carried out in accordance with the changing communication channel for each data packet, which still further increases possibility of error-free data reception by the receiving apparatus (hence increasing transmission speed as well), and leaving transmitter signal barely noticeable to the user.

Further, in the modulator 118, the corrected symbols are modulated, obtaining the information signal, and in the synchronization sequence addition unit 119 synchronous signals are added in the time domain to the data signal for simplification of the synchronization and channel alignment procedure in the receiving apparatus. Obtained in this way transmission signal is conveyed to digital-to-analog converter 102 and Loudspeaker 103—to the communication channel.

Thus pseudorandom samples from the information object are continuously transferred to the communication channel.

Figure 3:
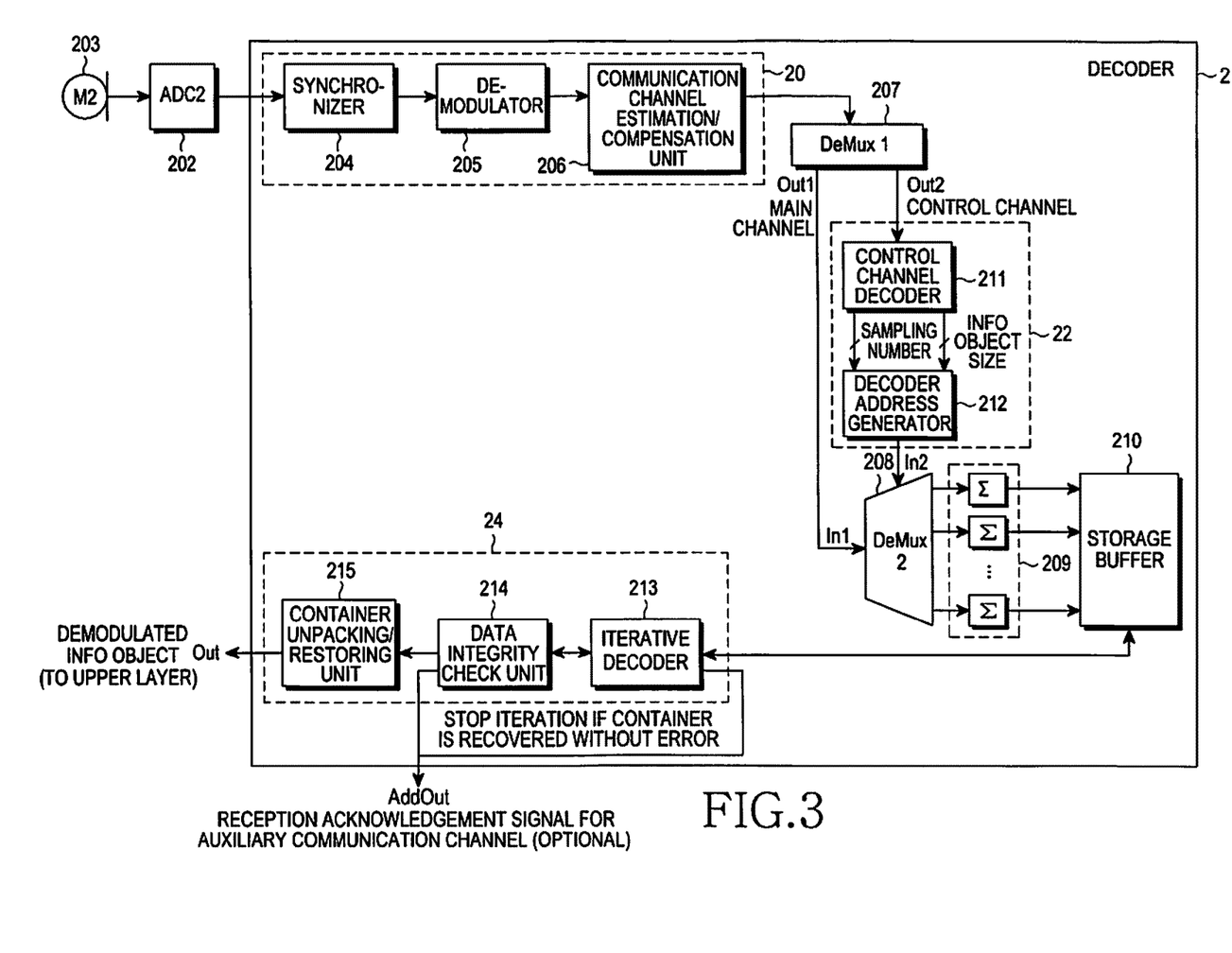
FIG. 3 is a block diagram of the receiving apparatus according to the present invention.

The receiving apparatus of the system, presented on FIG. 3, includes a decoder 2, to the input (In) of which a microphone (M2) 203 of the receiving apparatus is connected through an analog-to-digital converter (ADC2) 202 of the receiving apparatus.

The decoder 2 includes a demodulation module 20 for demodulating an input sound signal according to a preset modulation scheme; a first demultiplexer 207 for deciding a soft value of each reception bit output from the demodulation module 20 and separating sample bits and control packet bits containing information of a corresponding sample from each other; an address generation module 22 for generating an address corresponding to each bit of the corresponding sample; a second demultiplexer 208 for receiving the soft decision of the sample bits and demultiplexing and outputting the soft decision according to the address information generated by the address generation module 22; a summation unit for summing the soft decision for each output of the second demultiplexer 208; a storage buffer 210 for storing the summed soft decisions from the summation unit 209; and a decoding module 24 for decoding the samples stored in the storage buffer 210.

The demodulation module 20 includes a synchronizer 204, a demodulator 205, and a communication channel estimation/compensation unit 206, and the address generation module 22 includes a control channel decoder 211 and a decoder address generator 212. Further, the decoding module 24 includes an iterative decoder 213, a data integrity check unit 214, and a container unpacking/restoring unit 215.

Hereinafter, the configuration and operation of the decoder 2 and the receiving apparatus according to the present invention will be described in more detail.

The decoder 2 includes the decoder input synchronizer 204, demodulator 205, communication channel evaluation/compensation unit (CCECU) 206 and the first demultiplexer (DM1) 207, which are successively connected to each other.

The first output (Out1) of first demultiplexer (DM1) 207 is coupled to the first input (Input1) of the second demultiplexer (DM2) 208, outputs of which are connected through the respective summation units (Σ) 209 to the corresponding inputs of storage buffer (SB) 210. Number of summation units corresponds to the number of bits in the precoder buffer of the encoder.

The second output (Out2) of first demultiplexer (DM1) 207 is connected to control channel decoder 211, the first and the second outputs of which are connected to the respective inputs of decoder address generator 212, the output of which is coupled to the second input (In2) of the second demultiplexer (DM2) 208.

The storage buffer 210 is coupled to the output of the decoder, being the data output (Out) of the receiving apparatus, through the successively connected the iterative decoder (ID) 213, the data integrity checking unit (DICU) 214, and the unpacking/restoring unit 215. At the same time, the additional output of the data integrity checking unit is connected to the additional input of the iterative decoder, as well as to the additional output of the decoder, being the additional output (AddOut) of the receiving apparatus.

The receiving apparatus circuit is configured to enable the respective power supply to all circuit elements, requiring the said supply.

The receiving section of the system, including the receiving apparatus, operates in the following way:

The receiving apparatus is switched on, when the decoder 2, the analog-to-digital converter (ADC2) 202, and the microphone (M2) 203 are energized and are in standby mode.

The signal from the communication channel through the microphone (M2) 203 is conveyed to the analog-to-digital converter (ADC2) 202, where it is digitized and transferred to the input of the decoder. In synchronizer 204, after detection of the transmission signal by the synchronous signal, boundaries of the signal are restored and corrective adjustment of the sampling frequency is carried out, the incoming signal is received. Hereafter the received signal is conveyed to demodulator 205 with one or multiple carriers, implemented correspondingly to modulator 118 (on the basis of filter bank or fast Fourier transformation (see for example [1])). In the communication channel evaluation/compensation unit (CCECU) 206, using pilot symbols, evaluation of the communication channel and the noise components is carried out and a distortion spectrum is evaluated adaptively. In the first demultiplexer 207, "soft" values of the received bits are determined, separating sample bits for the "primary" channel and control packet bits for the "control" receiving channel.

The "soft" decisions of the control packet are conveyed to control channel decoder 211, designed in compliance with the control data encoder 114. In case of the control packet successful decoding, container size data through the first output of the control channel decoder and a sample identification number through the second output of the control channel decoder is transferred to the respective inputs of pseudorandom decoder address generator 212, analogous to the encoder address generator of the transmission apparatus. At the same time, bit addresses are generated in the decoder address generator, corresponding to the addresses of the precoder buffer of the transmission apparatus encoder.

The "soft" decisions, corresponding to the sample, are demultiplexed by the second demultiplexer (DM2) 208 in accordance with address information, generated by the decoder address generator. Hereafter, "soft" decisions with each received sample, are gradually cumulated in the corresponding summation unit (Σ) 209 (each storage unit corresponds to one bit in precoder buffer 109). Thus accumulated "soft" decisions after a certain number of received samples are saved in storage buffer 210. As soon as the definite required minimum number of "soft" decisions is delivered to the storage buffer (determined by iterative decoder 213) corresponding to the data package bits from precoder buffer 109, decoding procedure for the "soft" decisions of the data package received from precoder buffer 109 starts in iterative decoder 213.

Examples of such procedures are widely known (a similar procedure is described for example, in [3]), and are unrelated to the application subject and therefore are not dwelt upon in detail. It should be noted that decoding may start in iterative decoder, even when a part of cells in the storage unit is not filled. At the same time, the code properties while iterative decoding will be equivalent to the similar punctured code properties [4, 5], i.e. will be close to optimal.

After each decoding attempt in data integrity checking unit 214, requesting corresponding iteration (rigid decisions) from the iterative decoder, integrity of the received data package is checked (in accordance with the provided for by the encoder, using these rigid decisions. In case the check is successful, the received data package is transferred to the unpacking/restoring unit 215 for unpacking with the container extraction and the information object restoration. Additionally an iteration termination command is formed in the data integrity checking unit and conveyed to the iterative decoder. Then the information object is transferred through the output of the receiving apparatus to the user device (to the upper processing level). Simultaneously a reception acknowledgement signal may be generated using the additional output (Addout) of the receiving device and the acknowledgement signal is sending to the transmission apparatus via an optional auxiliary (backward) communication channel (for example, through the radio channel, acoustic channel or visual channel) of the receiving device.

Further data decoding from the storage buffer is carried out with a definite periodicity provided that during the complete decoding cycle (for example, determined by the several tens of iterations) the data package was not restored and a new sample through the first demultiplexer (DM1) 207 has arrived (i.e. storage buffer content is renewed). In the iterative decoder decoding procedure is started repeatedly, using the new data from the storage buffer. Such repeated decoding procedure is performed until the decoder is capable of error-free restoring of the transmitted data package of precoder buffer 109.

The described system has the following features.

First, without application of the backward communication channel the system is capable of transferring information object from the transmitter to the receiver within a minimum time interval provided there is a certain signal-to-noise ratio in the communication channel. In case of correct choice of the convolution encoder (in CE) and interleaving algorithm in the repeating/interleaving unit (which are known and not described in the given application) the encoder, used for information object transfer through any communication channel and the transmission system insures the transmission speed approximating information throughput of the communication channel in the wide range of signal-to-noise ratios.

Figure 4:
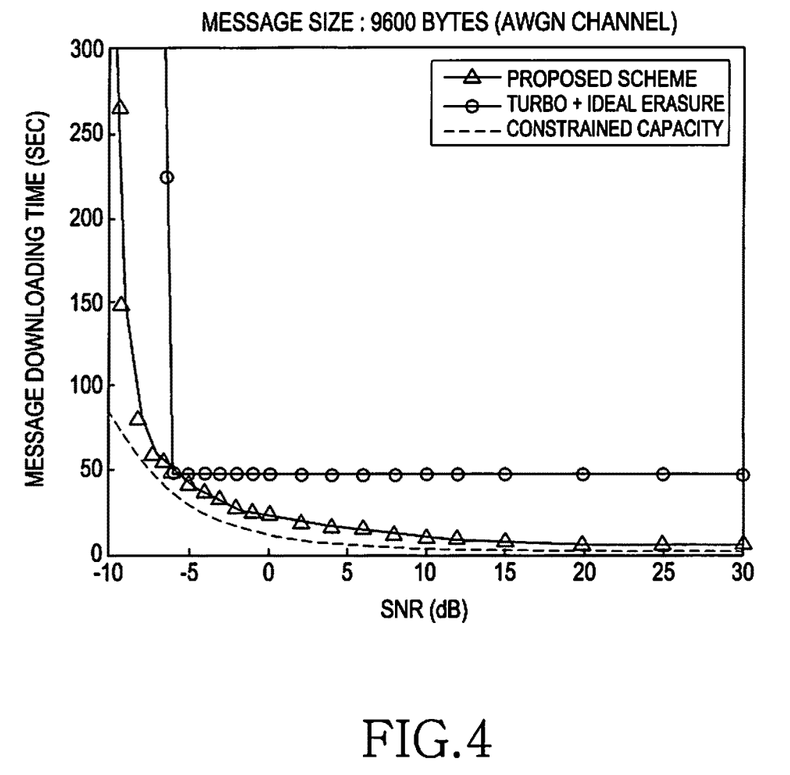
FIG. 4 illustrates the disclosed system parameters compared to the conventional method (in the form of dependence of time, required for object transmission, on signal to noise ratio in the communication channel).

Dependence of the transmission speed on the signal-to-noise ratio is illustrated on FIG. 4. Characteristics of the system are given for comparing purposes on FIG. 4, using a turbo-code in combination with an ideal code with erasure (for example, raptor code [6]). As is seen from the diagram comparison on FIG. 4, the traditional system, using the turbo code with the fixed code rate, is provided for a definite signal-to-noise ratio (in the given example for minus 6 dB) and in this point assures the transmission speed approximating information throughput of the communication channel. However, in case of an increase of signal-to-noise ratio, the transmission speed remains unchanged and differs considerably from the information throughput of the channel. Also in case of a decrease of the signal-to-noise ratio less than minus 6 dB the transmission speed drops drastically, since by such signal-to-noise ratios, correcting capacity of the fixed rate turbo-code does not allow to achieve reception of the information object with low error possibility.

In contrast, the disclosed system, inconsiderably losing out to the system with a fixed code in one point (minus 6 dB), enables the achievement of the transmission speed approximating information throughput of the channel in a wide range of signal-to-noise ratios. In the given example a real transmission system is used taking into account redundancy, connected with the control channel transmission and a necessity to transfer pilot signals for operation of the channel equalizer in the receiver. Accordingly, actual transmission speed can not closely approach theoretical information throughput of the channel. Besides, by low signal-to-noise ratios, problems appear connected with synchronization errors and the errors while control channel reception, affecting the system operation by the very low signal-to-noise ratios (less than minus 8 dB).

As a second feature, due to the application of the adaptive spectrum adjustment of the transmitted signal, the maximum transmitted signal power is achieved by the minimum acoustic perceptibility and at the same time preserving wide-band properties of the signal.

Despite of the fact that the invention is shown and described with the reference to its specific variants of the embodiment, specialists in the given art must understand that different changes in respect of the form and content can be made without deviating from the essence and the bounds of the invention, defined by the enclosed claims.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. An encoder comprising:
   a precoder for encoding an input information object according to a preset encoding scheme and storing the encoded information object in a precoder buffer;
   a sample number and address generation unit for generating a sample number of each sample and an address, which corresponds to each bit of each sample and the address of the precoder buffer;
   a multiplexer for selecting a bit of the precoder buffer corresponding to the address generated by the sample number and address generation module;
   a sampling buffer for storing a bit of each sample output from the multiplexer;
   a control packet generation module for generating a control packet including information on the sample number generated by the sample number/address generation module;
   a packet assembling unit for assembling the sample stored in the sampling buffer with the control packet generated by the control data generation module; and
   a modulation module comprising:
      a spectrum correction unit for correcting a spectrum of the packet output from the packet assembling unit,
      a modulator for modulating the packet from the spectrum correction unit into a sound signal according to at least one preset modulation scheme, and
      a synchronization sequence addition unit for adding a synchronous signal to the sound signal output from the modulator in a time domain.

2. The encoder as claimed in claim 1, further comprising a spectrum calculation module for receiving information on an exterior sound communication channel and obtaining a sound spectrum of the received sound communication channel, wherein the modulation module comprises a configuration for compensating for a spectrum of a sound signal based on the information provided by the spectrum calculation module.

3. The encoder as claimed in claim 2, wherein the spectrum calculation module comprises:
   a communication channel analyzer for receiving an exterior audible sound through an exterior microphone and an analog-to-digital converter and analyzing a spectrum configuration and a level of sound noise in a communication channel; and
   a spectrum estimator for receiving an output from the communication channel analyzer and calculating an optimal signal spectrum in compliance with a psycho-acoustic model of acoustic perception.

4. The encoder as claimed in claim 1, wherein the precoder comprises:
   a container compacting unit for adding a header label to the information object and performing a bite set for integrity checking, thereby packing the information object into a standard container; and
   a repeating and interleaving unit for receiving output data of the container compacting unit, repeating the output data a definite number of times determined in consideration of the size of the information object, and interleaving the repeated data.

5. The encoder as claimed in claim 4, wherein the precoder further comprises a convolution encoder for receiving data output from the repeating/interleaving unit, performing a convolution code encoding of the data, and storing a result of the convolution code encoding in the precoder buffer.

6. The encoder as claimed in claim 1, wherein the sample number/address generation module comprises:
   a sample number generator for generating a sample number for identification of a sample at a preset period; and
   an encoder address generator for generating a pseudorandom number of addresses in consideration of the size of the information object during generation of the sample number.

7. The encoder as claimed in claim 1, wherein the control packet generation module comprises:
   a control data generation unit for generating control data including information relating to the size of the information object and the sample number; and
   a control data encoder for generating the control packet by encoding the control data according to a preset scheme, which has a higher noise immunity than the encoding scheme of the sample.

8. A decoder comprising:
   a demodulation module comprising:
      a synchronizer for detecting an incoming signal by a synchronous signal from an input sound signal,
      a demodulator for demodulating the input sound signal according to a preset modulation scheme, and
      a communication channel estimation and compensation unit for performing evaluation and compensation of a distortion spectrum of a communication channel and noise components in the demodulated signal;
   a first demultiplexer for separating sample bits and control packet bits containing information of a corresponding sample from each other;
   an address generation module for generating address information corresponding to each bit of the corresponding sample according to the control packet;
   a second demultiplexer for receiving a soft decision of the sample bits and demultiplexing and outputting the soft decision according to the address information generated by the address generation module;
   a summation unit for summing the soft decision for each output of the second demultiplexer;
   a storage buffer for storing the summed soft decisions from the summation unit; and a decoding module for decoding the samples stored in the storage buffer.

9. The decoder as claimed in claim 8, wherein the synchronizer restores boundaries of the incoming signal, and performs a corrective adjustment of the sampling frequency.

10. The decoder as claimed in claim 8, wherein the address generation module comprises:
   a control channel decoder for receiving control packet bits and decoding a control packet including information relating to a sample number and a size of an information object of a transmitted signal; and
   a decoder address generator for generating a pseudorandom number of addresses in consideration of the size of the information object.

11. The decoder as claimed in claim 8, wherein the decoding module comprises:
   an iterative decoder for performing iterative decoding of information stored in the storage buffer;
   a data integrity check unit for checking an integrity of the information iteratively decoded by the iterative decoder, and outputting the information when the checking is successful; and
   a container unpacking/restoring unit for unpacking the information output from the data integrity check unit, extracting a container of the transmitted information object, and restoring the information object.

12. The decoder as claimed in claim 11, wherein the decoder generates a reception acknowledgement signal according to the result of the checking by the data integrity check unit, and the decoder sends the reception acknowledgement signal to a transmitter side via a communication channel.

13. An encoding method comprising the steps of:
   encoding an input information object according to a preset encoding scheme;
   selecting a preset set of bits from the encoded data and outputting the selected set of bits as a sample;
   generating a control packet including information on a sample number for identifying the sample;
   assembling the sample with the control packet;
   correcting a spectrum of the assembled packet;
   modulating the assembled packet into a sound signal according to at least one preset modulation scheme;
   adding a synchronous signal to the sound signal in a time domain; and
   receiving information on an exterior sound communication channel and obtaining a sound spectrum of the received sound communication channel, wherein a spectrum of the sound signal is compensated for when modulation of the sound signal is performed;
   wherein the step of obtaining the sound spectrum comprises:
      receiving an exterior audible sound through an exterior microphone and an analog-to-digital converter and analyzing a spectrum configuration and a level of sound noise in a communication channel; and
      calculating an optimal signal spectrum in compliance with a psycho-acoustic model of acoustic perception.

14. The encoding method as claimed in claim 13, wherein the step of modulating the assembled packet into a sound signal comprises:
   correcting the spectrum of the assembled packet according to the calculated optimal signal spectrum.

15. The encoding method as claimed in claim 13, wherein the step of encoding an input information object comprises the steps of:

adding a header label to the information object and performing a bite set for integrity checking, thereby packing the information object into a standard container; and
receiving the packed data, repeating the received data a definite number of times in consideration of a size of the information object, and interleaving the repeated data.

16. The encoding method as claimed in claim 15, wherein the step of encoding an input information object further comprises a step of receiving the repeated and interleaved data, and performing a convolution code encoding of the data.

17. The encoding method as claimed in claim 13, wherein the step of selecting a preset set of bits from the encoded data comprises the steps of:
   generating a sample number for identification of a sample at a preset period; and
   generating a pseudorandom number of addresses in consideration of the size of the information object during generation of the sample number.

18. The encoding method as claimed in claim 13, wherein the step of generating a control packet comprises the steps of:
   generating control data including information relating to the size of the information object and the sample number; and
   generating the control packet by encoding the control data according to a preset scheme.

19. A decoding method comprising the steps of:
   detecting an incoming signal by a synchronous signal from an input sound signal, restoring boundaries of the incoming signal, and performing a corrective adjustment of the sampling frequency;
   demodulating the input sound signal according to a preset modulation scheme;
   performing evaluation and compensation of a distortion spectrum of a communication channel and noise components in the demodulated signal;
   separating sample bits and control packet bits containing information of a corresponding sample from each other in demodulated received bits;
   generating address information corresponding to each bit of the corresponding sample according to the control packet;
   summing a soft decision of the sample bits for each piece of the generated address information; and
   performing a sample decoding of the summed information.

20. The decoding method as claimed in claim 19, wherein the step of generating address information comprises the steps of:
   receiving control packet bits and decoding a control packet including information relating to a sample number and a size of an information object of a transmitted signal; and
   generating a pseudorandom number of addresses in consideration of the size of the information object.

21. The decoding method as claimed in claim 19, wherein the step of performing a sample decoding comprises the steps of:
   performing iterative decoding of the summed information;
   checking an integrity of the iteratively decoded information, and outputting the information when the checking is successful; and
   unpacking the information output through the integrity checking, extracting a container of the transmitted information object, and restoring the information object.

22. The decoding method as claimed in claim 21, wherein the step of checking the integrity of the iteratively decoded information comprises;
   generating a reception acknowledgement signal; and
   sending the reception acknowledgement signal to a transmitter side via a communication channel.

23. An encoding and decoding method, which comprises
   encoding an input information object according to a preset encoding scheme;
   selecting a preset set of bits from the encoded data and outputting the selected set of bits as a sample;
   generating a control packet including information on a sample number for identifying the sample;
   assembling the sample with the control packet;
   correcting a spectrum of the assembled packet;
   modulating the assembled packet into a sound signal according to at least one preset modulation scheme;
   adding a synchronous signal to the sound signal in a time domain;
   detecting an incoming signal by the synchronous signal from an input sound signal, restoring boundaries of the incoming signal, and performing a corrective adjustment of the sampling frequency;
   demodulating the input sound signal according to a preset modulation scheme;
   performing evaluation and compensation of a distortion spectrum of a communication channel and noise components in the demodulated signal;
   separating sample bits and control packet bits containing information of a corresponding sample from each other in demodulated received bits;
   generating address information corresponding to each bit of the corresponding sample according to the control packet;
   summing a soft decision of the sample bits for each piece of the generated address information; and
   performing a sample decoding of the summed information.

* * * * *